(12) United States Patent
Ito

(10) Patent No.: US 7,389,937 B2
(45) Date of Patent: Jun. 24, 2008

(54) CARD-SHAPED MEMORY DEVICE INCORPORATING IC CARD FUNCTION

(75) Inventor: Takafumi Ito, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 246 days.

(21) Appl. No.: 11/295,587

(22) Filed: Dec. 7, 2005

(65) Prior Publication Data

US 2006/0131430 A1 Jun. 22, 2006

(30) Foreign Application Priority Data

Dec. 15, 2004 (JP) ............................. 2004-363400

(51) Int. Cl.
*G06K 19/06* (2006.01)
(52) U.S. Cl. .................. 235/492; 235/476; 235/487
(58) Field of Classification Search ............... 235/492, 235/487, 380, 476; 257/286; 365/226
See application file for complete search history.

(56) References Cited

U.S. PATENT DOCUMENTS

| | | | |
|---|---|---|---|
| 6,573,567 B1 | 6/2003 | Nishizawa et al. | |
| 6,611,012 B2 * | 8/2003 | Miyamoto et al. | 257/286 |
| 6,912,172 B2 * | 6/2005 | Honma et al. | 365/226 |
| 6,942,157 B2 * | 9/2005 | Nozawa et al. | 235/492 |
| 2001/0006902 A1 | 7/2001 | Ito | |
| 2005/0006484 A1 | 1/2005 | Ito | |

FOREIGN PATENT DOCUMENTS

| | | |
|---|---|---|
| JP | 11-204720 | 7/1999 |
| JP | 2000-123141 | 4/2000 |
| JP | 2001-160125 | 6/2001 |

* cited by examiner

*Primary Examiner*—Seung H Lee
(74) *Attorney, Agent, or Firm*—Oblon, Spivak, McClelland, Maier & Neustadt, P.C.

(57) ABSTRACT

A card-shaped memory device includes first to third chips which are stacked together on a first surface of a substrate. The first chip has a control function, the second chip has a memory function, and the third chip has an IC card function. The third chip is located in a position other than the lowest one of the positions of the first to third chips.

16 Claims, 4 Drawing Sheets

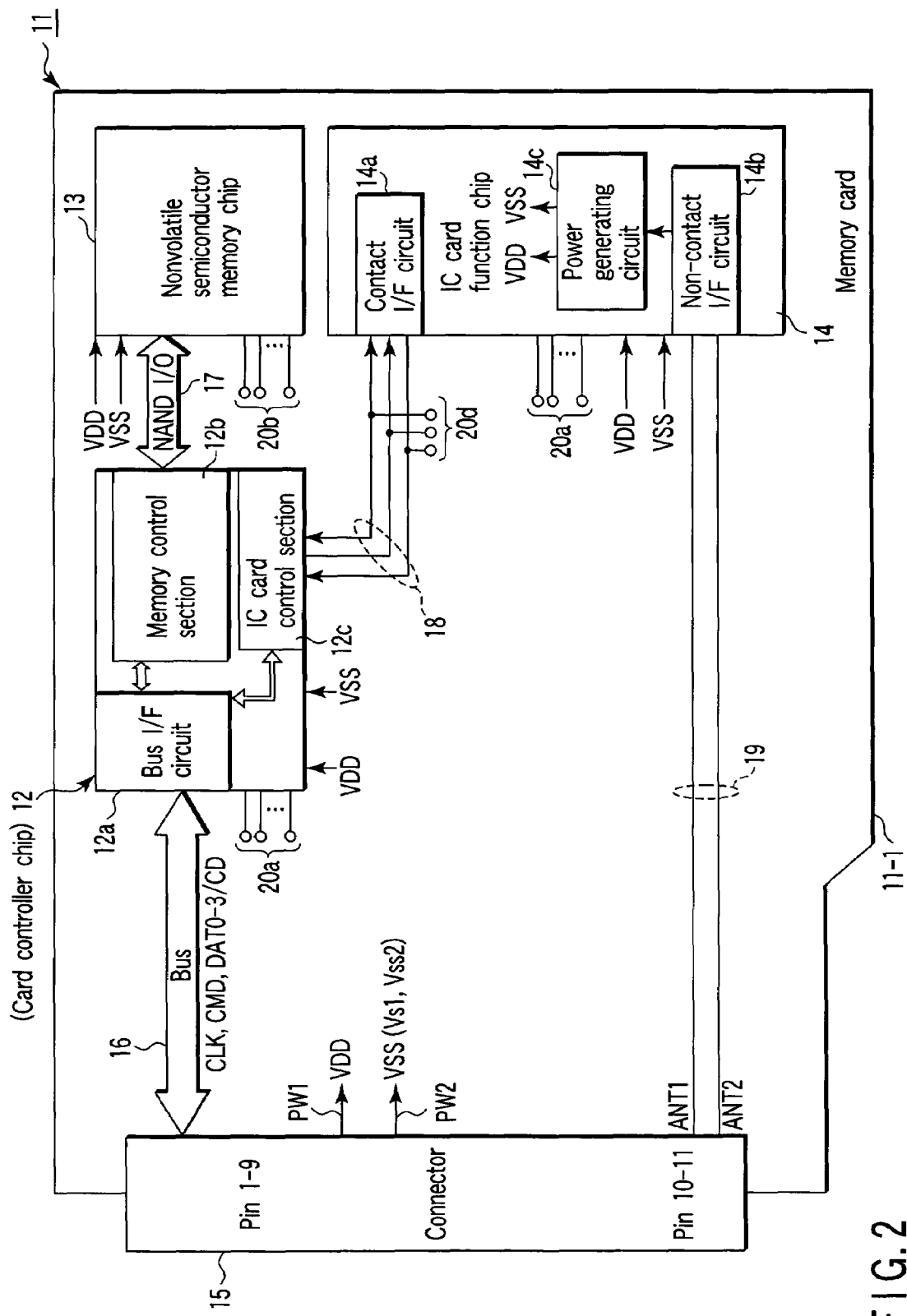
F I G. 2

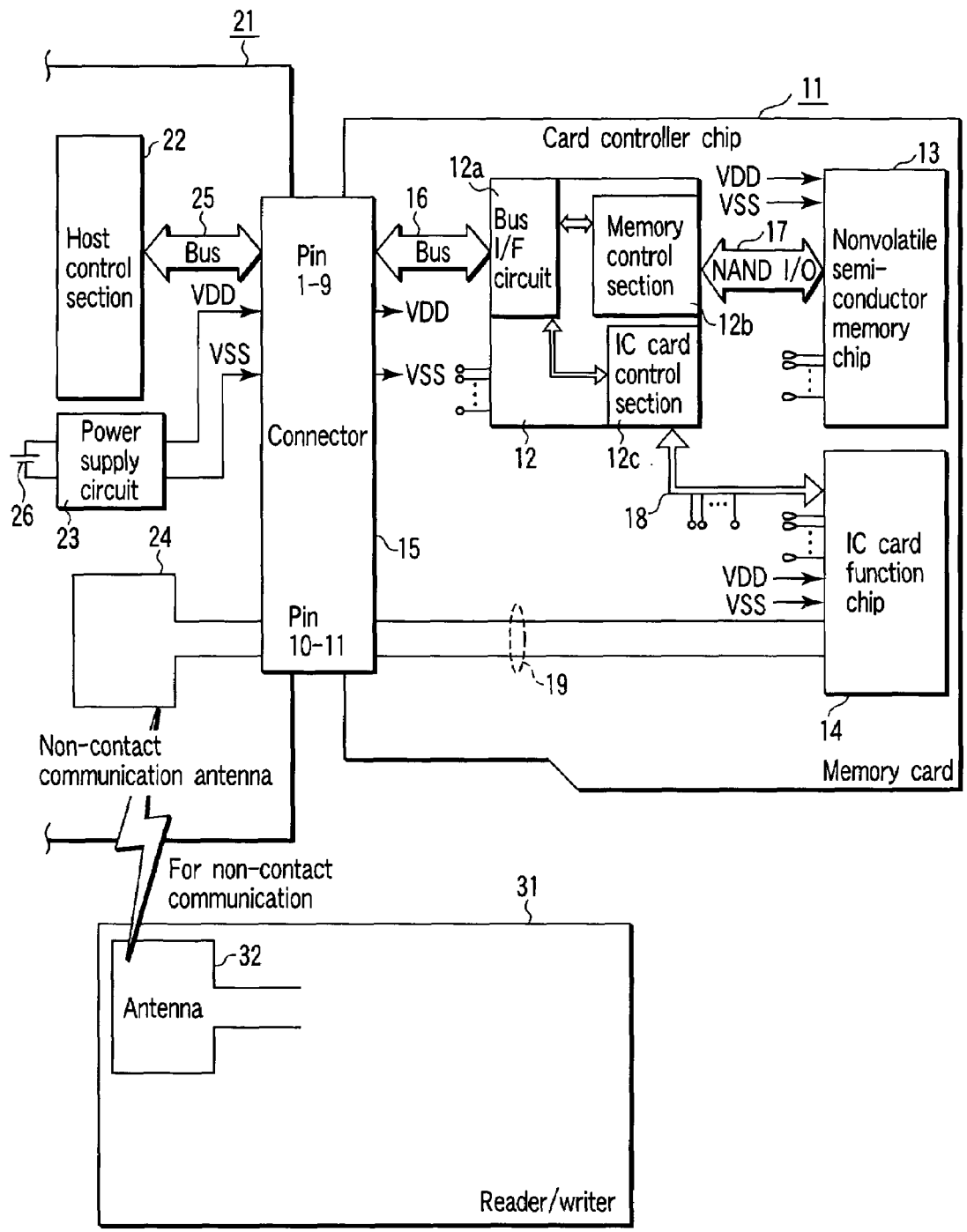
F I G. 3

CARD-SHAPED MEMORY DEVICE INCORPORATING IC CARD FUNCTION

CROSS-REFERENCE TO RELATED APPLICATIONS

This application is based upon and claims the benefit of priority from prior Japanese Patent Application No. 2004-363400, filed Dec. 15, 2004, the entire contents of which are incorporated herein by reference.

BACKGROUND OF THE INVENTION

1. Field of the Invention

The present invention relates to a card-shaped memory device such as a memory card, which incorporates multiple IC chips.

2. Description of the Related Art

A small memory card serving as a data storage medium for, e.g., a digital camera or cell phone has been developed. The memory card can exchange data with a host device, such as the digital camera or cell phone, while it is inserted in the host device. The memory card comprises a circuit substrate on which, e.g., a nonvolatile semiconductor memory chip and a memory controller chip are mounted, and a package accommodating the circuit substrate. Memory cards having increasingly smaller size and greater memory capacity have been produced in accordance with which, techniques have been developed by which the memory chips are incorporated into the memory card and stacked together (as disclosed in, e.g., Jpn. Pat. Appln. KOKAI Publications Nos. 2001-160125, 2000-123141 and 11-204720).

In recent years, the functions of memory cards have diversified. As a result, as well as a data storage function, a memory card is required to have a so-called IC card function which enables it to double as a financial card such as a credit card, cash card or prepaid card, and an ID card such as a driving license or passport.

It is necessary to reliably prevent a chip having such an IC card function from being broken by stress when the memory card is manufactured or used, since it stores vital data such as accounting information.

Furthermore, since the chips incorporated in the memory card have different functions, it is required that each chip be easily manufactured and easily testable during manufacture.

BRIEF SUMMARY OF THE INVENTION

According to a first aspect of the invention, there is provided a card-shaped memory device which comprises: a substrate; and first to third chips stacked together on a first surface of the substrate, the first chip having a control function, the second chip having a memory function, the third chip having an IC card function, the third chip being located in a position other than a lowest one of positions of the first to third chips.

According to a second aspect of the invention, there is provided a card-shaped memory device which comprises: a substrate; a first chip provided on the substrate, and having a memory function; a second chip provided above the first chip, and having an IC card function; and a third chip provided above the first chip, and having a control function.

According to a third aspect of the invention, there is provided a memory card system which comprises: a host device; and a memory card connected to the host device, and comprising a substrate and first to third chips which are stacked together on a first surface of the substrate, the first chip having a control function, the second chip having a memory function, the third chip having an IC card function, the third chip being located in a position other than a lower one of positions of the first to third chips.

BRIEF DESCRIPTION OF THE SEVERAL VIEWS OF THE DRAWING

FIG. 2 is a configuration view showing circuits of the card-shaped memory device according to the embodiment of the present invention.

FIG. 3 is a configuration view showing a state wherein the card-shaped memory device shown in FIG. 2 is used.

DETAILED DESCRIPTION OF THE INVENTION

Figure 1A:
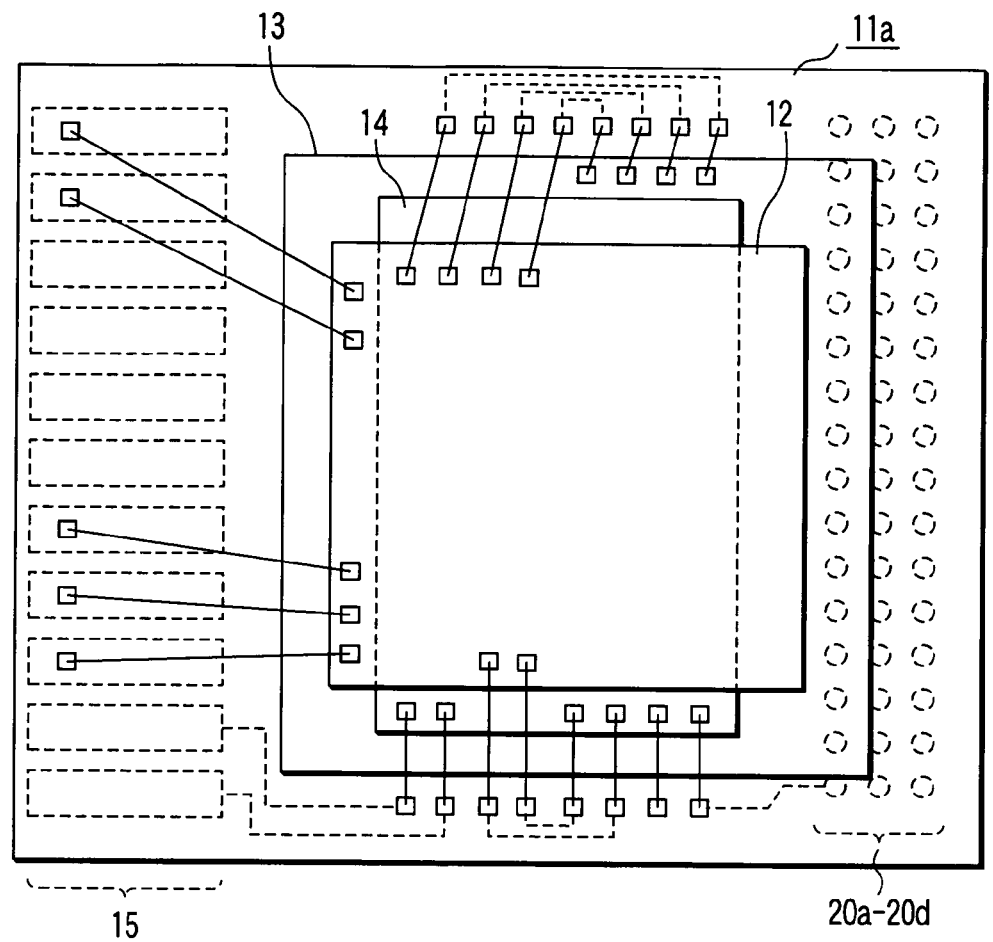
FIG. 1A is a plan view showing the internal structure of a card-shaped memory device according to an embodiment of the present invention.

An embodiment of the present invention will be explained with reference to the accompanying drawings.

FIG. 2 shows a card-shaped memory device, e.g., a memory card 11, according to an embodiment of the present invention. In the memory card 11, e.g., a card controller 12, a nonvolatile memory chip 13, and an IC card function chip 14 are provided in, e.g., a card case 11-1. Further, a connector 15 is provided at, e.g., a side surface of the memory card 11. The connector 15 includes a plurality of pins (terminals) to which, e.g., an end of a bus 16 is to be connected. In addition, the connector 15 further includes, e.g., two pins to which a power supply voltage VDD and a ground potential VSS are to be connected, and also, e.g., two pins to which an antenna is to be connected.

The card controller chip 12 comprises a bus interface (I/F) circuit 12a, a memory control section 12b and an IC card control section 12c. The bus I/F circuit 12a is connected to the other end of the bus 16, and is also connected to the memory control section 12b and the IC card control section 12c. The bus I/F circuit 12a supplies, e.g., a clock signal CLK, a command CMD and data DAT0-3, which are supplied from a host device not shown through the bus 16, to the memory control section 12b and the IC card control section 12c, and outputs, e.g., data which is supplied from the memory control section 12b and the IC card control section 12c, to the bus 16. The memory control section 12b is connected to the nonvolatile semiconductor memory chip 13 by a bus 17, and the IC card control section 12c is connected to the IC card function chip 14 by a circuit line 18. It should be noted that the card controller chip 12 has functions of performing encryption/decryption and authentication according to, e.g., Content Protection for Recordable Media (CPRM) based on a common key method, in order to secure a copyright on content data stored in the nonvolatile semiconductor memory chip 13.

The nonvolatile semiconductor memory chip 13 is a flash memory comprising, e.g., a NAND EEPROM cells. The nonvolatile semiconductor memory 13 writes, reads or erases data in response to a command given from the memory control section 12b through an 8-bit wide data/command interface 17.

Furthermore, a region (data storage region) to which data in the nonvolatile semiconductor memory chip 13 is to be written is divided into a number of regions for respective types of data to be stored. For example, the nonvolatile semiconductor memory chip 13 comprise, as data storage regions, a general region for storing user data and a secure region for storing important data. The general region is a region which can be freely accessed and used by a user of the memory card 11. The secure region is a region which can be accessed only when a host device 21 connected to the memory card 11 is authenticated in mutual authentication between the host device 21 and the memory card 11.

Furthermore, the IC card function chip 14 is connected to the IC card control section 12c by the circuit line 18, and is also connected to an antenna terminal of the connector 15 by circuit lines 19. The IC card function chip 14 has a non-contact wireless communication function, and can transmit and receive an electromagnetic signal through an antenna of the host device, when the memory card 11 is connected to the host device.

To be more specific, the IC card function chip 14 comprises a contact interface (I/F) circuit (wire interface) 14a, a non-contact interface (I/F) circuit (antenna interface) 14b, and a power generating circuit 14c. The contact I/F circuit 14a is connected to the IC card control section 12c by the circuit line 18. The contact I/F circuit 14a is an interface circuit complying with ISO7816, and performs 1-bit serial communication with the IC card control section 12c. The non-contact I/F circuit 14b is an interface circuit complying with ISO14443 for wireless communication through the host device, which will be described later, and is connected to antenna pins of the connector 15 by the circuit lines 19. The power generating circuit 14c generates power necessary for the operation of the IC card function chip 14 based on a signal supplied through the antenna of the host device, when the antenna of the host device is connected to the connector 15.

The IC card function chip 14 is a semiconductor chip having a so-called IC card function such as those of a credit card, a cash card, a prepaid card, a employee card and public ID cards, e.g., kinds of licenses and a passport. In order to achieve the IC card function, the IC card function chip 14 has an advanced security function such as a tamperproof security function, which is achieved due to, e.g., a common key cipher "Advanced Encryption Standard (AES)" which is securer than "Public Key Infrastructure (PKI)". Also, to achieve such an advanced security function, the IC card function chip 14 incorporate a nonvolatile semiconductor memory not shown, for storing data of, e.g., the above credit card.

It should be noted that the power supply voltage VDD and the ground potential Vss applied from the host device to power supply pins of the connector 15 are applied to the card controller chip 12, the nonvolatile semiconductor memory chip 13 and the IC card function chip 14. Due to a power supply switching circuit not shown, the IC card function chip 14 can select one of the power generated by the power generating circuit 14c and that supplied from the power supply pins.

Furthermore, test pads 20a, 20b, 20c and 20d are connected to the card controller chip 12, the nonvolatile semiconductor memory chip 13, the IC card function chip 14 and the circuit line 18, respectively. The test pads 20a, 20b, 20c and 20d receive signals for tests from testing devices not shown, at the time of testing, and then supply the signals to the card controller chip 12, the nonvolatile semiconductor memory chip 13, the IC card function chip 14 and the circuit line 18.

FIG. 3 shows that the memory card 11 is connected to the host device 21. As the host device 21, for example, a cell phone or a card-shaped adapter can be applied. The host device 21 comprises, e.g., a host control section 22, a power supply circuit 23, an antenna 24 formed in the shape of, e.g., a loop, a bus 25 and a battery 26. The control section 22 is connected to pins of the connector 15 by the bus 25. The control section 22 generates a clock signal, various commands and data, all for use in controlling the memory card 11.

Furthermore, the power supply voltage VDD and the ground potential VSS from the power supply circuit 23 are applied to the power supply pins of the connector 15. In addition, both ends of the antenna 24 are connected to the antenna pins of the connector 15.

Figure 4:
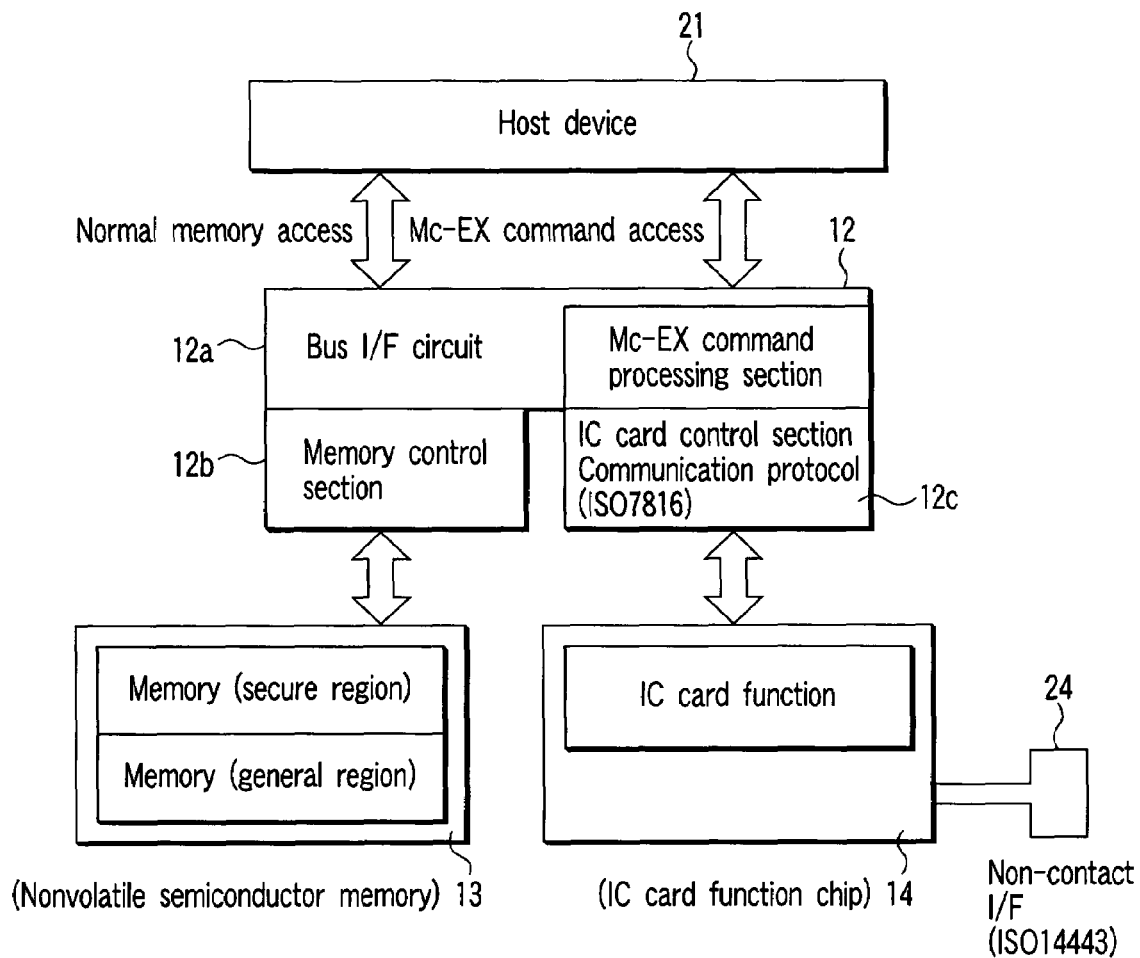
FIG. 4 is a view showing a logical interface of the card-shaped memory device shown in FIGS. 2 and 3.

FIG. 4 shows a logical interface which has the configuration shown in FIG. 3. The outline of the operation of the logical interface will be explained with references to FIGS. 2 to 4.

When the nonvolatile semiconductor memory 13 of the memory card 11 is accessed from the host device 21, writing of data to the nonvolatile semiconductor memory 13 or reading of data therefrom is controlled in response to a memory access command issued from the host device 21. That is, the memory control section 12b writes write data transmitted from the host device 21 through the bus 16 and the bus I/F circuit 12a to the general region or the secure region of the nonvolatile semiconductor memory chip 13, and transfers data read from the nonvolatile semiconductor memory chip 13 to the host device 21 through the bus I/F circuit 12a and the bus 16.

On the other hand, when data is transmitted to or from the IC card function chip 13, the IC card function chip 13 is controlled in response to a "Mobile Communication Extension Standard (McEX)" command issued from the host device 21. That is, the McEX command from the host device 21 is given to the IC card control section 12c through the bus 16 and the bus I/F circuit 12a. After receiving a command data "Command-Application Protocol Data Unit (C-APDU) ", the IC card control section 12c transmits the command data to the IC card function chip 14 in accordance with a communication protocol complying with ISO7816. Further, the IC card control section 12c transfers data (Response-Application Protocol Data Unit (R-APDU)), which is transmitted from the IC card function chip 14 in accordance with the communication protocol complying with ISO7816, to the host device 21 through the bus I/F circuit 12a and the bus 16.

Figure 1B:
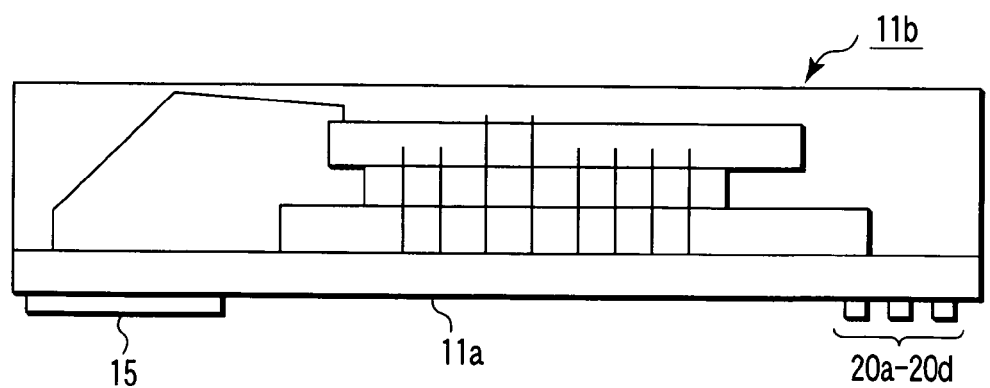
FIG. 1B is a vertical sectional view of a side of the card-shaped memory device shown in FIG. 1A.

When the IC card function is used, the antenna 24 of the host device 21, as shown in FIG. 3, is brought close to, e.g., an external device having a non-contact communication function, such as an antenna 32 of a reader/writer 31. In this state, communication is carried out between the reader/writer 31 and the IC card function chip 14 through the antennas 24 and 32. FIGS. 1A and 1B show the internal structure of the memory card according to the embodiment of the present invention. In FIGS. 1A and 1B, the same structural members as in FIGS. 2 and 3 are denoted by the same reference numerals, respectively, as in FIGS. 2 and 3.

As shown in FIGS. 1A and 1B, on one of both surfaces of a substrate 11a, the nonvolatile semiconductor memory chip 13, the IC card function chip 14 and the card controller chip 12 are successively stacked. At this time, they are bare. At the other surface of the substrate 11a, a plurality of pins constituting the connector 15 and the test pads 20a to 20d are provided. The nonvolatile semiconductor memory chip 13, the IC card function chip 14 and the card controller chip 12 are connected to each other by using bonding wire and wiring patterns formed at the substrate 11a. Similarly, the card controller chip 12 and the connector 15 are connected to each other by using bonding wire and a wiring pattern formed at the substrate 11a. Also, the pads 20a to 20d associated with the nonvolatile semiconductor memory chip 13, the IC card function chip 14, the card controller chip 12 and the circuit line 18 are connected to each other by circuit lines, not shown, formed at the substrate 11a.

The nonvolatile semiconductor memory chip 13, the IC card function 14 and the card controller 12 provided on the substrate 11a are covered by a molded package 11b formed of resin as shown in FIG. 1B, thereby forming a System in Package (SiP), which has, e.g., a size of 21.5 mm×20 mm×1.4 mm. Then, the SiP is provided in a card case not shown, and the card case is sealed, thereby obtaining the memory card 11.

In the SiP, of the above three chips, the IC card function chip 14 is required to have the highest reliability, since it stores accounting information, etc. Therefore, it is undesirable that the IC card function chip 14 is located in contact with the substrate 11a. This is because the smaller the distance between the chip and the substrate 11a, the more easily the chip is subject to a mechanical stress due to deformation of the substrate.

Therefore, in the embodiment, as shown in FIGS. 1A and 1B, the largest one of the chips, i.e., the nonvolatile semiconductor memory chip 13, is provided in contact with the substrate 11a, the IC card function chip 14 is provided on the nonvolatile semiconductor memory chip 13, and the card controller chip 12 is provided on the IC card function chip 14. That is, in the embodiment, the nonvolatile semiconductor memory chip 13 is located in the lowest position for the three chips, the card control chip 12 is located in the highest position for the chips, and the IC card function chip 14 is located between the nonvolatile semiconductor memory chip 13 and the card control chip 12. Also, it should be noted that the IC card function chip 14 can also be provided on the card control chip 12.

The above explanation of the embodiment is given with respect to the case where the three chips are stacked together. However, the embodiment can also be applied to the case where four or more chips are stacked. In this case, it suffices that the IC card function chip is located in such a manner as to satisfy the above condition.

As described above, according to the embodiment, the IC card function chip 14 is located in a position other than the lowest position for the chips. Therefore, the mechanical stress on the IC card function chip 14 required to have the highest reliability can be restricted, thus improving the reliability of the memory card.

In the manufacturing process of the memory card, after formation of the SiP, the chips are inspected separately in the following manner: in a unit test mode of the nonvolatile semiconductor memory chip 13, the terminal of the card controller chip 12, which is connected to the nonvolatile semiconductor memory chip 13 by the bus 17, is set at Hi-Z (high impedance state) by a signal supplied to the test pads 20a. In this state, the testing device, not shown, for the nonvolatile semiconductor memory chip 13 supplies a predetermined test signal to the test pads 20b for the nonvolatile semiconductor memory chip 13, to thereby test the nonvolatile semiconductor memory chip 13.

In a unit test of the IC card function chip 14, the terminal of the IC card control section 12c, which is connected to the IC card function chip 14, is set at Hi-Z by a signal supplied to the test pads 20a for the memory card controller. In this state, the testing device, not shown, for the IC card function chip 14 supplies a predetermined test signal to the test pads for the IC card function chip 14, to thereby test the IC card function chip 14.

In a test of the entire memory card 11 incorporating the card controller chip 12, a predetermined test signal is supplied to the test pads 20a for the card controller chip 12, to thereby test the function of the card controller chip 12, accessing to the nonvolatile semiconductor memory chip 13 through the card controller chip 12, and accessing to the IC card function chip 14.

Furthermore, in the case of testing the interface between the card controller chip 12 and the IC card function chip 14, the test pads 20d are used.

In the above embodiment, the test pads 20a, 20b, 20c and 20d are connected to the card controller chip 12, the nonvolatile semiconductor memory chip 13, the IC card function chip 14 and the circuit line 18, respectively, thus enabling signals for test to be supplied to the card controller chip 12, the nonvolatile semiconductor memory chip 13, the IC card function chip 14 and the circuit line 18 through the test pads 20a, 20b, 20c and 20d, respectively. Thus, the nonvolatile semiconductor memory chip 13 and the IC card function chip 14, which are provided as independent functional units, can be inspected in different steps. Therefore, the card controller chip 12, the nonvolatile semiconductor memory chip 13 and the IC card function chip 14 can be designed and manufactured independently of each other, thus improving the manufacturing efficiency of those chips. In addition, the security of information on the internal design of the IC card function chip 14, which is required to be more reliably concealed, can be ensured.

Furthermore, as described above, the above chips can be designed, manufactured and tested individually. Thus, the memory card can be modified simply by modifying one or ones of the chips, that is, not all the chips need to be modified, thus enabling various memory cards to be manufactured. That is, this feature enables various products to be more easily manufactured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A card-shaped memory device comprising:
   a substrate; and
   first to third chips stacked together on a first surface of the substrate, the first chip having a control function, the second chip having a memory function, the third chip having an IC card function,
   wherein the third chip is located in a position other than a lowest one of positions of the first to third chips.

2. The device according to claim 1, wherein:
   the first chip receives a command from an external device, and performs processing in accordance with the command;
   the second chip is connected to the first chip, and stores data; and
   the third chip is connected to the first chip, and processes security data.

3. The device according to claim 1, further comprising a connector which includes a command terminal, a data terminal and an antenna terminal, the command terminal and the data terminal being connected to the first chip, the antenna terminal being connected to the third chip.

4. The device according to claim 3, further comprising a plurality of test pads which are connected to the first to third chips, respectively.

5. The device according to claim 4, wherein the connector and the test pads are formed at a second surface of the substrate.

6. A card-shaped memory device comprising:
a substrate;
a first chip provided on the substrate, and having a memory function;
a second chip provided above the first chip, and having an IC card function; and
a third chip provided above the first chip, and having a control function.

7. The device according to claim 6, wherein:
the third chip receives a command from an external device, and performs processing in accordance with the command;
the first chip is connected to the third chip, and stores data; and
the second chip is connected to the third chip, and processes security data.

8. The device according to claim 6, further comprising a connector which includes a command terminal, a data terminal and an antennal terminal, the command terminal and the data terminal being connected to the third chip, the antenna terminal being connected to the second chip.

9. The device according to claim 8, further comprising a plurality of test pads which are connected to the first to third chips, respectively.

10. The device according to claim 9, wherein the first to third chips are formed on a first surface side of the substrate, and the connector and the test pads are formed on a second surface side of the substrate.

11. A memory card system comprising:
a host device; and
a memory card connected to the host device, and comprising a substrate and first to third chips which are stacked together on a first surface of the substrate, the first chip having a control function, the second chip having a memory function, the third chip having an IC card function, the third chip being located in a position other than a lower one of positions of the first to third chips.

12. The system according to claim 11, wherein:
the first chip receives a command from an external device, and performs processing in accordance with the command;
the second chip is connected to the first chip, and stores data; and
the third chip is connected to the first chip, and processes security data.

13. The system according to claim 11, further comprising a connector which includes a command terminal, a data terminal and an antenna terminal, the command terminal and the data terminal being connected to the first chip, the antennal terminal being connected to the IC card function chip.

14. The system according to claim 13, further comprising a plurality of test pads which are connected to the first to third chips, respectively.

15. The system according to claim 14, wherein the connector and the test pads are formed at a second surface of the substrate.

16. The system according to claim 11, wherein the host device is one of a cell phone and a card-shaped adapter.

* * * * *